United States Patent
Doglio et al.

(10) Patent No.: US 8,144,463 B2
(45) Date of Patent: Mar. 27, 2012

(54) CARD RETENTION SYSTEM

(75) Inventors: Jean Doglio, Pflugerville, TX (US); Bernard Strmiska, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 168 days.

(21) Appl. No.: 12/756,565

(22) Filed: Apr. 8, 2010

(65) Prior Publication Data

US 2011/0249395 A1    Oct. 13, 2011

(51) Int. Cl.
*G06F 1/16* (2006.01)

(52) U.S. Cl. ............ 361/679.58; 248/612; 439/567; 362/418

(58) Field of Classification Search .......... 248/206.5, 248/125.9, 612; 361/679.32, 679.58, 679.02, 361/679.09, 679.48, 679.47, 679.33, 679.55, 361/679.21, 679.27; 439/188, 567, 101; 362/371, 375, 362, 269, 418, 86, 296.01; 62/259.2, 74; 347/32, 92, 85, 29, 86, 93

See application file for complete search history.

(56) References Cited

U.S. PATENT DOCUMENTS

| | | | |
|---|---|---|---|
| 5,640,309 A | 6/1997 | Carney et al. | |
| 5,673,175 A | 9/1997 | Carney et al. | |
| 5,748,453 A | 5/1998 | Carney et al. | |
| 6,056,333 A | 5/2000 | Wach | |
| 6,215,673 B1 * | 4/2001 | Gordon et al. | 361/801 |
| 6,499,198 B2 | 12/2002 | Eckenrode | |
| 6,639,807 B1 | 10/2003 | Carney et al. | |
| 6,669,250 B1 | 12/2003 | St. Louis | |
| 6,700,791 B1 | 3/2004 | Zappacosta | |
| 6,738,261 B2 | 5/2004 | Vier et al. | |
| 6,937,481 B1 | 8/2005 | Newman et al. | |
| 7,097,220 B2 | 8/2006 | Haba | |
| 7,113,407 B2 * | 9/2006 | Holt et al. | 361/726 |
| 7,140,900 B1 | 11/2006 | Villanueva | |
| 7,165,790 B2 | 1/2007 | Bella et al. | |
| 7,201,411 B2 | 4/2007 | Bella et al. | |
| 7,479,870 B2 | 1/2009 | Masuyama et al. | |
| 7,646,592 B2 | 1/2010 | McCormick et al. | |
| 7,666,019 B2 | 2/2010 | Jaramillo et al. | |
| 2006/0199419 A1 * | 9/2006 | Carr et al. | 439/372 |

* cited by examiner

*Primary Examiner* — Hung Duong
(74) *Attorney, Agent, or Firm* — Haynes and Boone, LLP

(57) ABSTRACT

A card retention system includes a chassis comprising a chassis wall. A plurality of actuation channels are defined by the chassis wall. Each of the plurality of actuation channels includes an unsecured section, a secured section, and an arcuate section extending between the unsecured section and the secured section. A securing member is coupled to the chassis wall through the plurality of actuation channels. The securing member is operable to move relative to the chassis wall along a path defined by the plurality of actuation channels. A plurality of engagement members are located on the securing member. The securing member may be moved through the plurality of actuation channels to retain a plurality of cards in the chassis.

20 Claims, 10 Drawing Sheets

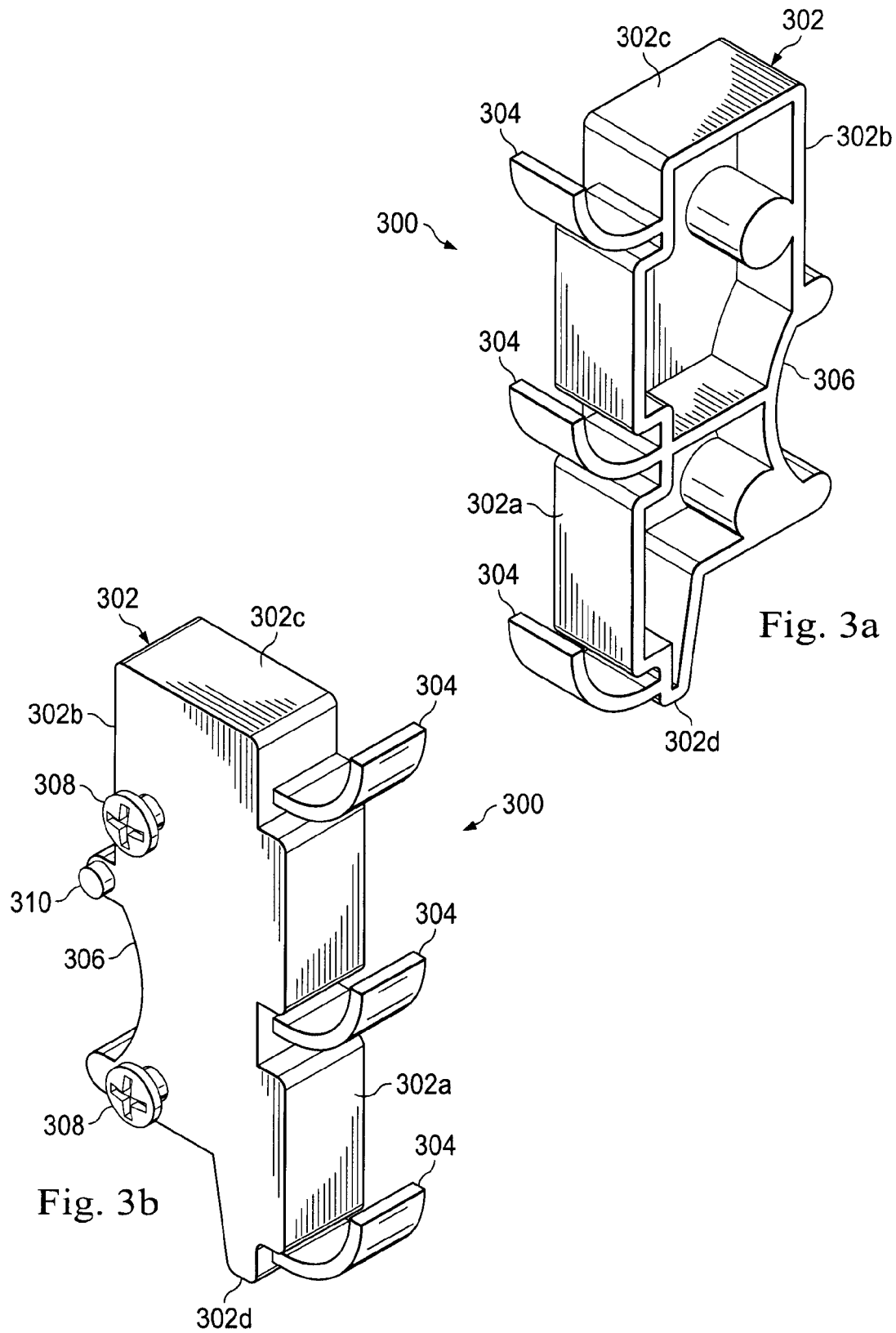

CARD RETENTION SYSTEM

BACKGROUND

The present disclosure relates generally to information handling systems, and more particularly to card retention system for cards in an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Many IHSs include cards such as, for example, Peripheral Component Interconnect (PCI) cards, that are coupled to the IHS in order to provide additional functionality to the IHS that may include networking functions, audio functions, video functions, additional ports, and/or a variety of other added functionality known in the art. The retaining of these cards in the IHS raises a number of issues. For example, when the cards are located adjacent a structural wall in an IHS chassis, some conventional card retaining systems require that a relatively large section of the structural wall be removed to accommodate the card retaining system, reducing the stiffness of the structural wall and causing the structural wall to flex. Furthermore, space constraints render alternative conventional card retaining systems unusable in such IHS chassis, as there may not be enough space around the card retaining system to comfortably actuate the card retaining system. Other alternative conventional card retaining systems may require multi-hand operation, which complicates their actuation, or may include components that are not captive to the IHS chassis, which raises the chance of loss of system components that allow the cards to be retained.

Accordingly, it would be desirable to provide an improved card retaining system.

SUMMARY

According to one embodiment, a card retention system includes a chassis including a chassis wall, a plurality of actuation channels defined by the chassis wall, wherein each of the plurality of actuation channels comprises an unsecured section, a secured section, and an arcuate section extending between the unsecured section and the secured section, a securing member coupled to the chassis wall through the plurality of actuation channels, wherein the securing member is operable to move relative to the chassis wall along a path defined by the plurality of actuation channels, and a plurality of engagement members located on the securing member.

BRIEF DESCRIPTION OF THE DRAWINGS

FIG. 2b is a perspective view illustrating an embodiment of actuation channels on the chassis of FIG. 2a.

FIG. 3a is a perspective view illustrating an embodiment of a securing member used with the chassis of FIGS. 2a and 2b.

FIG. 3b is a perspective view illustrating an embodiment of the securing member of FIG. 3a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
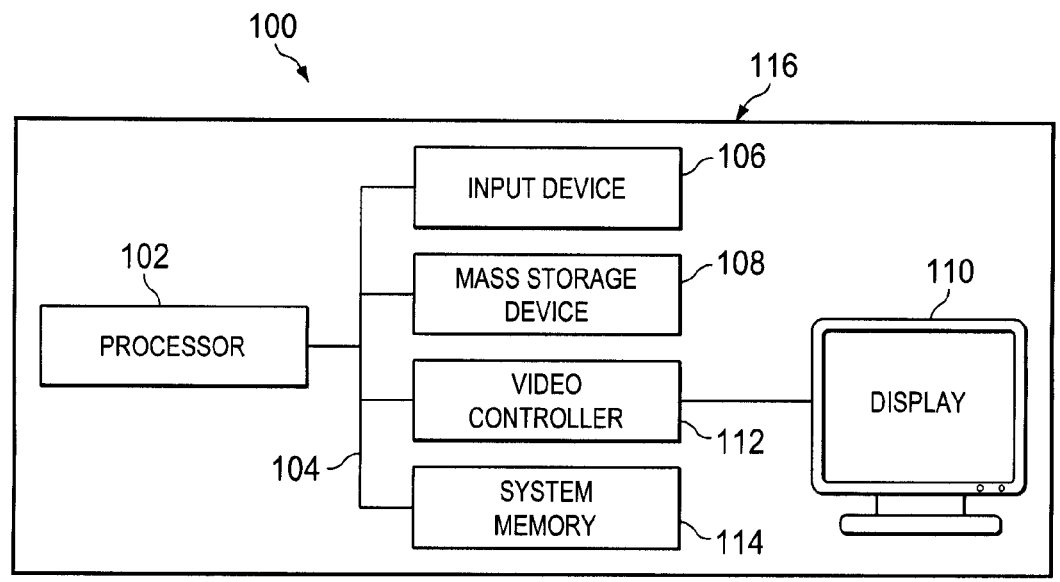
FIG. 1 is a schematic view illustrating an embodiment of an IHS.
Figure 4A:
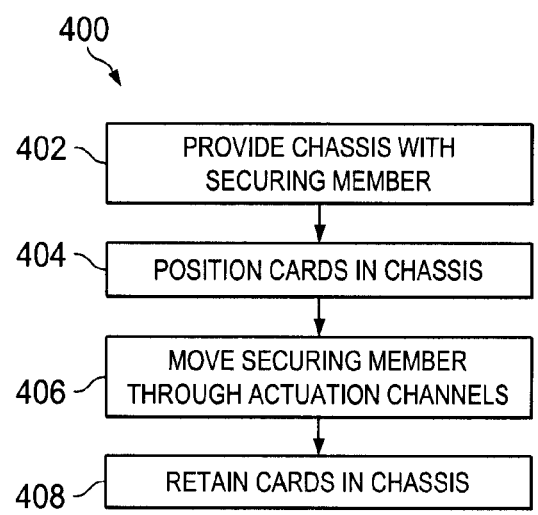
FIG. 4a is a flow chart illustrating an embodiment of a method for retaining a card in a chassis.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
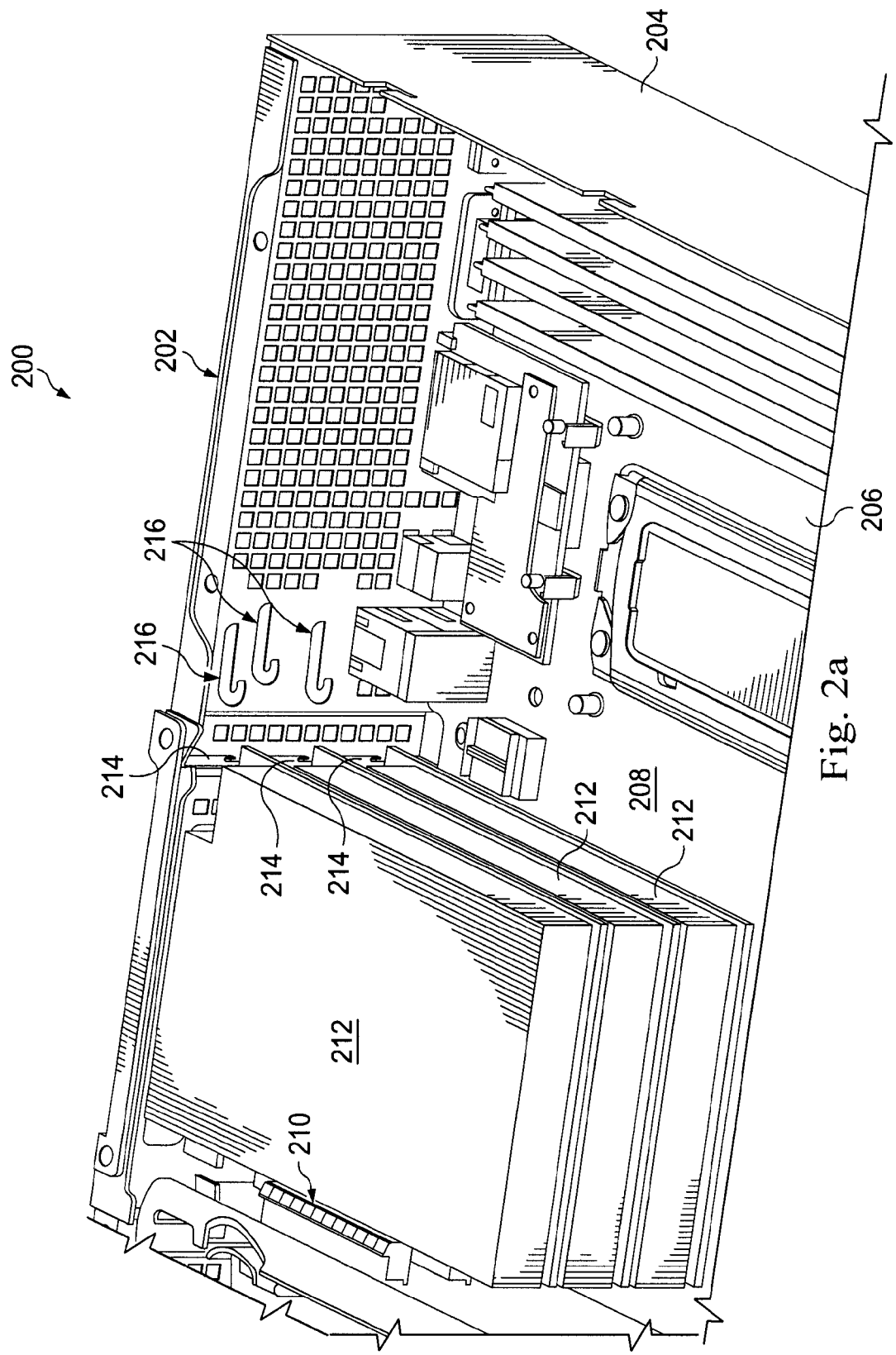
FIG. 2a is a perspective view illustrating an embodiment of a chassis.
Figure 2B:
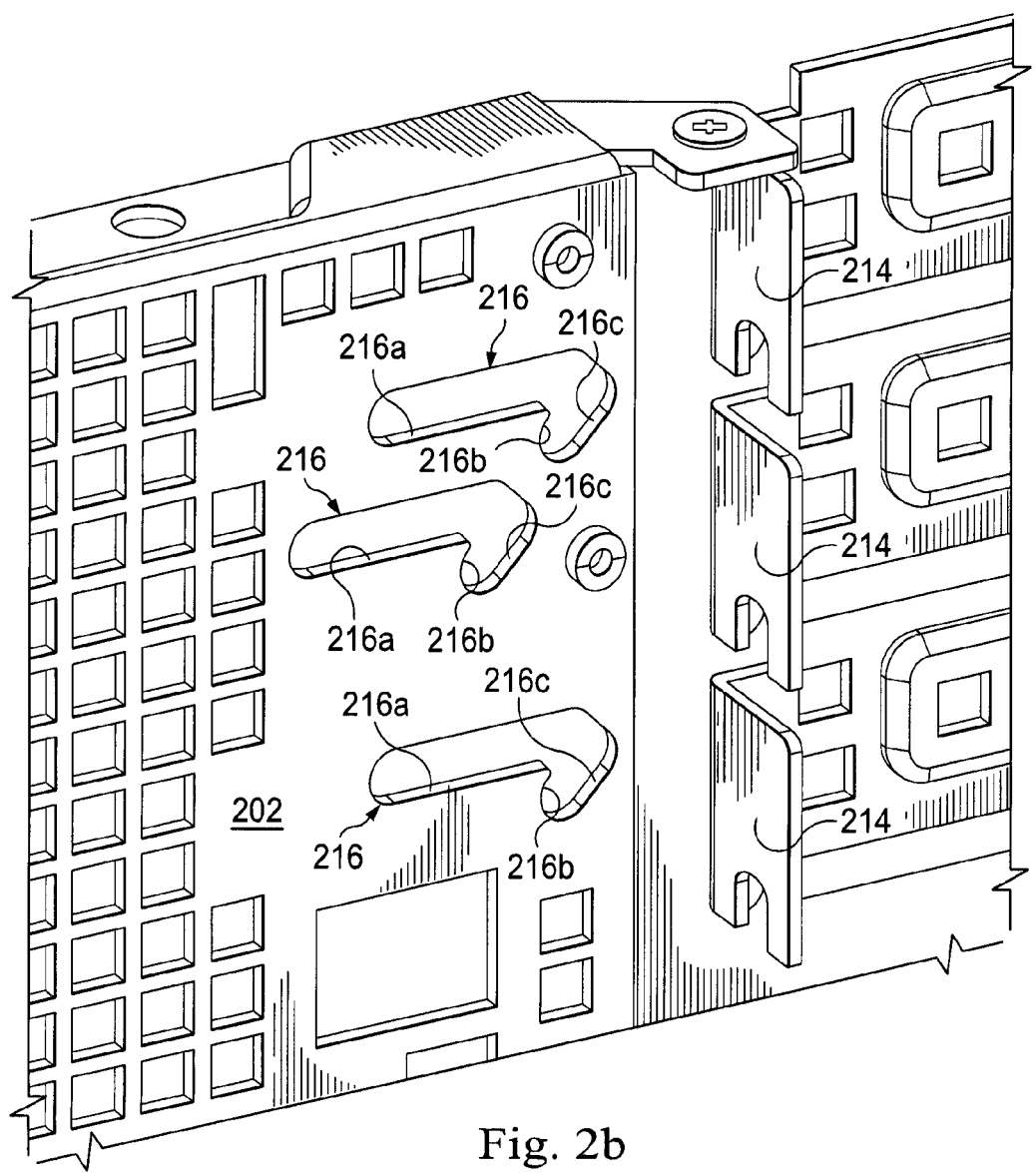

Referring now to FIGS. 2a and 2b, a chassis 200 is illustrated. In an embodiment, the chassis 200 may be the chassis 116, described above with reference to FIG. 1, and may house some or all of the components of the IHS 100. The chassis 200 includes a plurality of chassis walls 202, 204 and 206 that are oriented substantially perpendicularly to each other such that the chassis walls 202, 204 and 206 define a chassis housing 208 between them. A plurality of card connectors 210 (one of which is illustrated in FIG. 2a) are located in the chassis housing 208. In an embodiment, the card connectors 210 may be coupled to a processor such as, for example, the processor 102 described above with reference to FIG. 1. A plurality of cards 212 are coupled to the card connectors 210. In an embodiment, the cards 212 may be PCI cards, PCI Express cards, and/or a variety of other IHS components known in the art. Each card 212 includes a bracket 214 on an end of the card 212 that is located adjacent the chassis wall 202 when the card 212 is coupled to the card connector 210. A plurality of actuation channels 216 are defined by the chassis wall 202 and located adjacent the brackets 214 on the plurality of cards 212. Each of the actuation channels 216 includes an unsecured section 216a, a secured section 216b, and an arcuate section 216c extending between the unsecured section 216a and the secured section 216b. In an embodiment, the dimensions of the actuation channels 216 are chosen to remove less of the chassis wall 202 than is removed in conventional retention systems in order to provide a rigidity in the chassis wall 202 that is not present in conventional retention systems.

Referring now to FIGS. 3a and 3b, a securing member 300 is illustrated. The securing member 300 includes a base 302 having a front surface 302a, a rear surface 302b located opposite the base 302 from the front surface 302a, a top surface 302c extending between the front surface 302a and the rear surface 302b, and a bottom surface 302d located opposite the base 302 from the top surface 302c and extending between the front surface 302a and the rear surface 302b. A plurality of engagement members 304 extend from the front surface 302a of the base 302 in a spaced apart orientation from each other such that a first engagement member 304 is located adjacent the top surface 302c, a second engagement member 304 is located adjacent the bottom surface 302d, and a third engagement member 304 is located between the first and second engagement members 304, as illustrated in FIGS. 3a and 3b. In an embodiment, each engagement member 304 is a resilient spring that is operable to deflect from the rest position, illustrated in FIGS. 3a and 3b, in response to engagement with a surface (described in further detail below). A finger actuation surface 306 is defined by the base 302 and located adjacent the rear surface 302b of the base 302. A plurality of coupling members 308 are located in a spaced-apart orientation from each other and extend from a surface on the base 302 that is located between the front surface 302a, the rear surface 302b, the top surface 302c, and the bottom surface 302d. In an embodiment, the coupling members 308 include fasteners such as, for example, screws. A guide member 310 extends from a surface of the base member 302 that is adjacent the rear surface 302b.

Figure 4B:
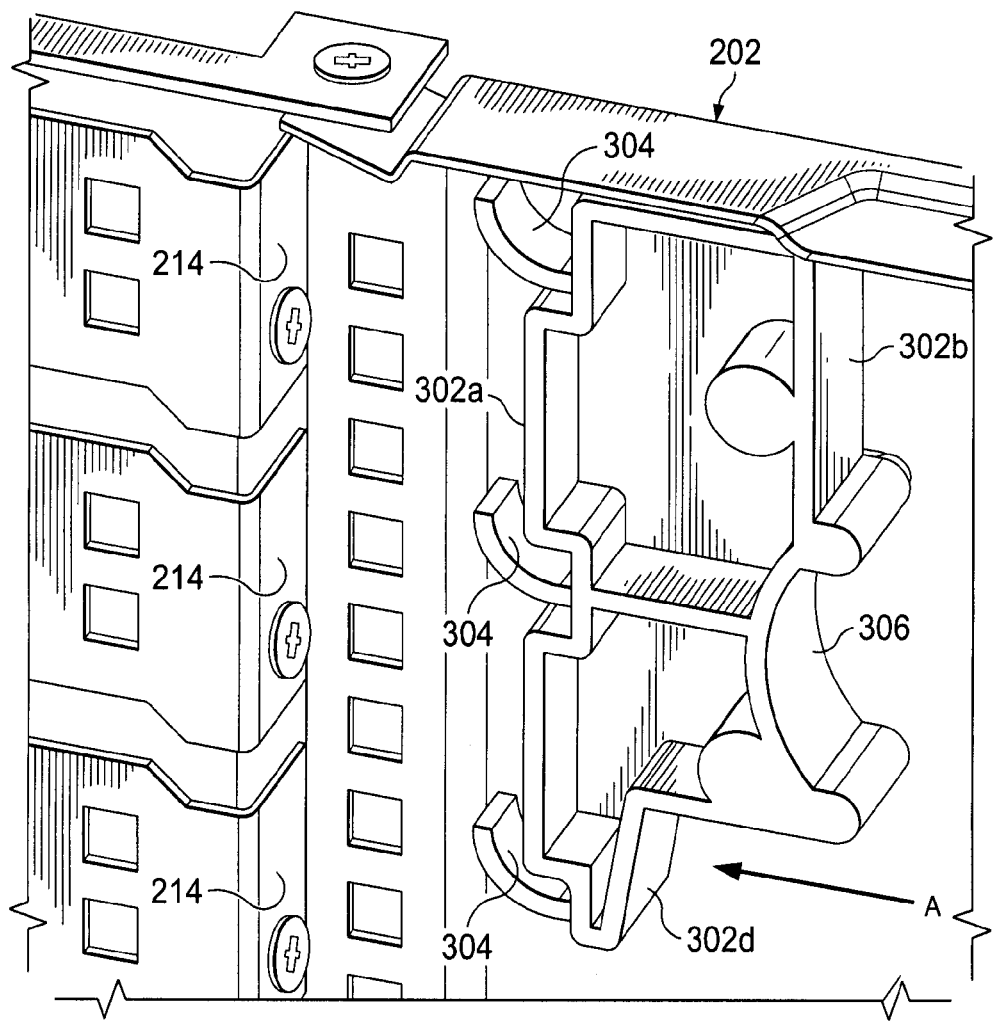
FIG. 4b is a perspective view illustrating an embodiment of the securing member of FIGS. 3a and 3b coupled to the chassis of FIGS. 2a and 2b.
Figure 4C:
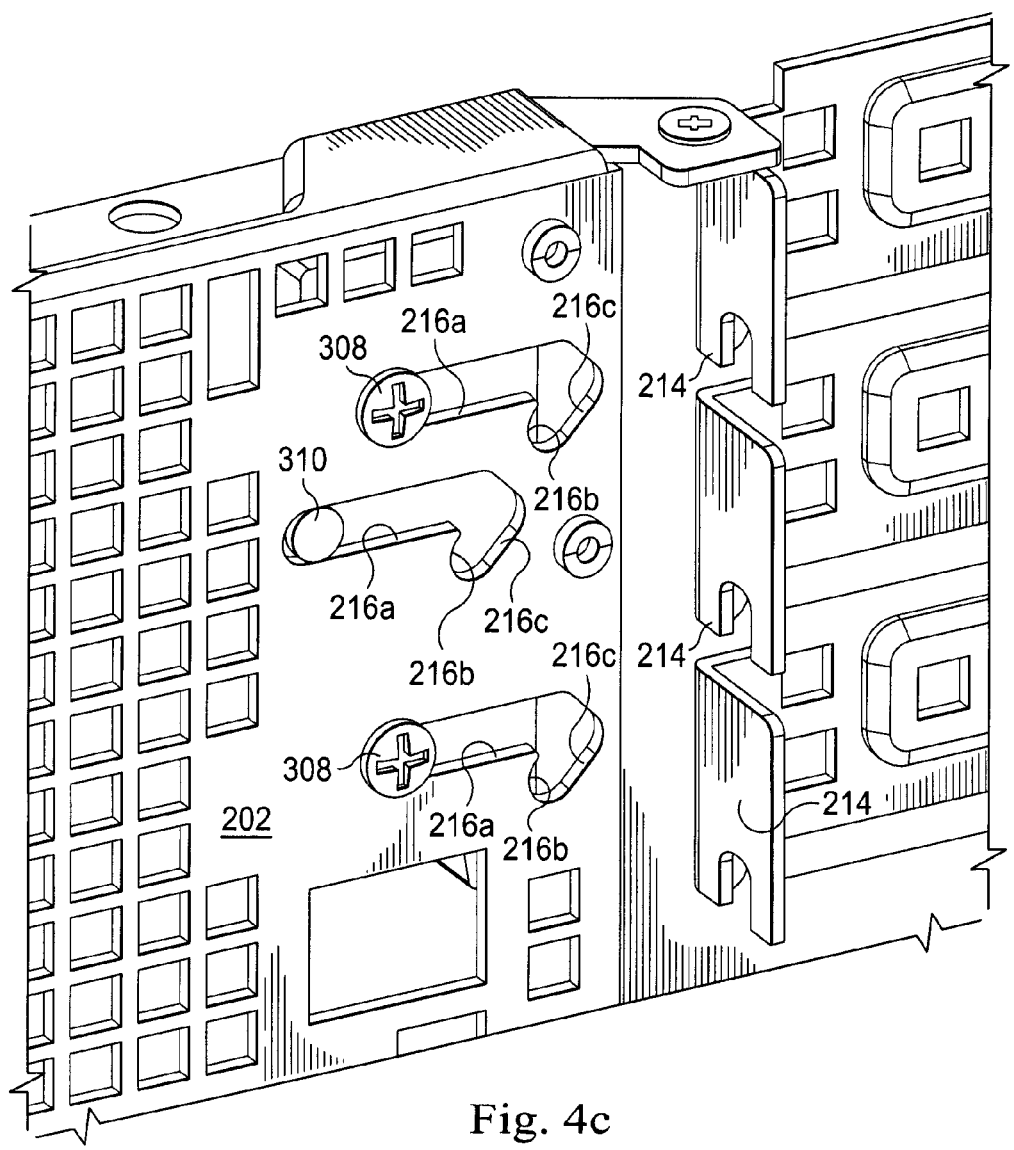
FIG. 4c is a perspective view illustrating an embodiment of the securing member of FIGS. 3a and 3b coupled to the chassis of FIGS. 2a and 2b.

Referring now to FIGS. 2a, 3b, 3a, 3b, 4a, 4b and 4c, a method 400 for retaining cards in a chassis is illustrated. The method 400 begins at block 402 where a chassis with a securing member is provided. The securing member 300, FIGS. 3a and 3b, may be coupled to the chassis 200, FIGS. 2a and 2b, by positioning the coupling members 308 and the guide member 310 in the unsecured sections 216a of the actuation channels 216, as illustrated in FIG. 4c. In an embodiment, the coupling members 308 may be screws and may be positioned in the unsecured sections 216a of the actuation channels 216 by disconnecting the coupling members 308 from the securing member 300 and then reconnecting the coupling members 308 to the securing member 300 through the actuation channels 216. As can be seen from FIGS. 4b and 4c, the securing member 300 is captive in the chassis 200 once it is coupled to the chassis wall 202 such that it remains in the chassis 200 when it is not in use. The method 400 then proceeds to block 404 where cards are positioned in the chassis. The cards 212 may be positioned in the chassis 200 by coupling the cards 212 to the card connectors 210 in the chassis housing 208 such that the brackets 214 on the cards 212 are located adjacent the chassis wall 202, as illustrated in FIG. 2a. With the securing member 300 coupled to the chassis 200 with the coupling members 208 and the guide member 310 positioned in the unsecured sections 216a of the actuation channels 216, the engagement members 304 are spaced apart from the brackets 214 on the cards 212, as illustrated in FIG. 4b.

Figure 4D:
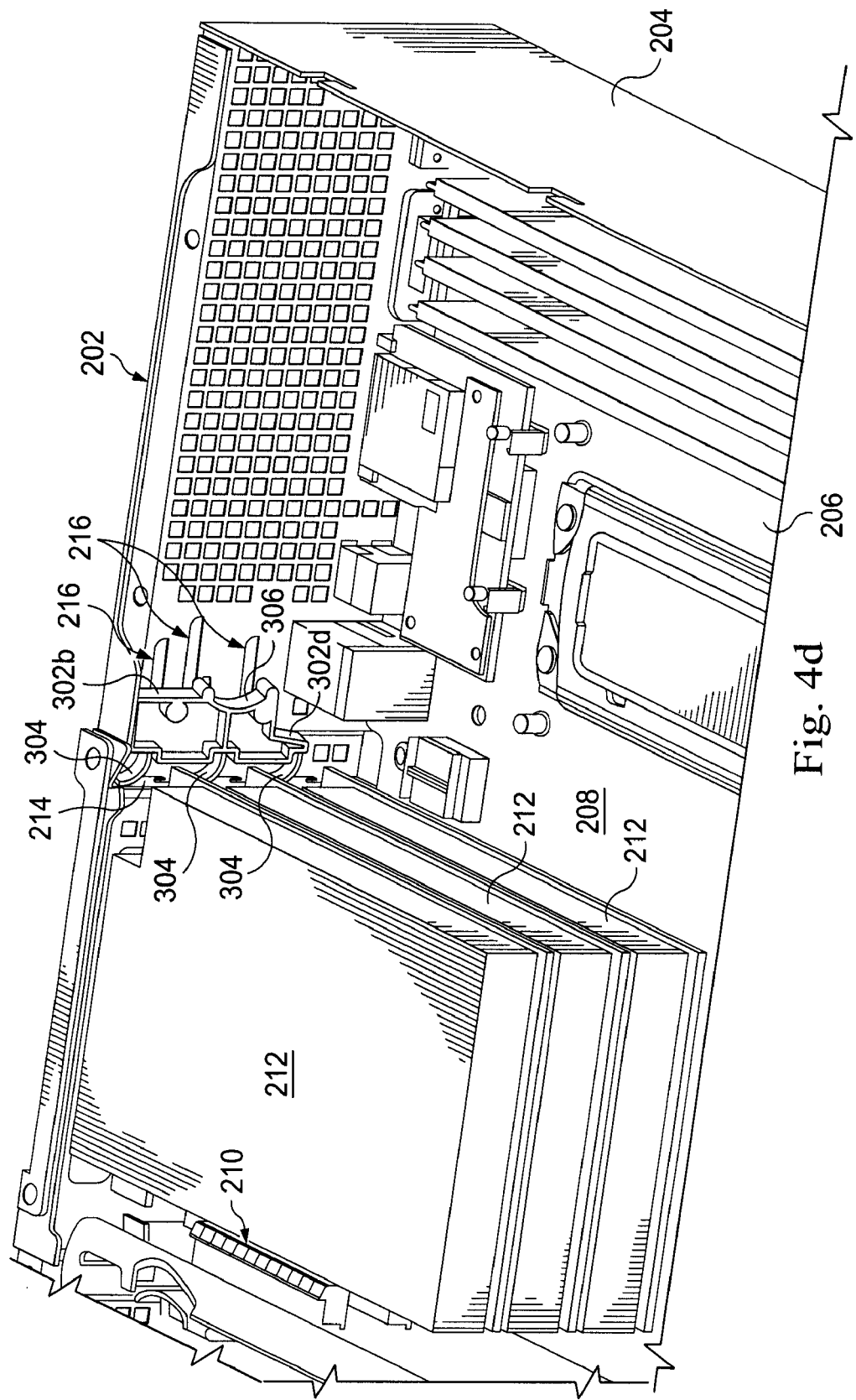
FIG. 4d is a perspective view illustrating an embodiment of the securing member and chassis of FIGS. 4b and 4c with the securing member engaging a plurality of cards.
Figure 4E:
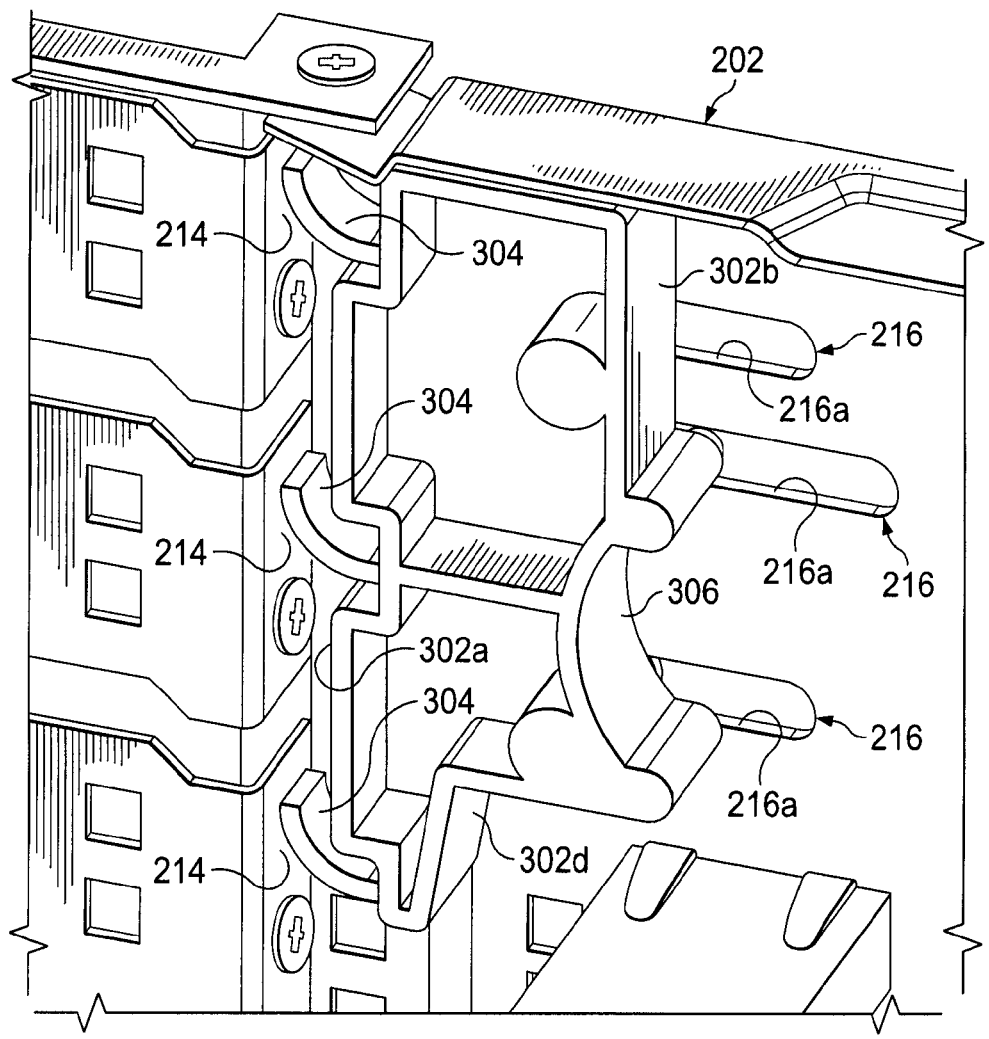
FIG. 4e is a perspective view illustrating an embodiment of the securing member and chassis of FIGS. 4b and 4c with the securing member engaging a plurality of cards.
Figure 4F:
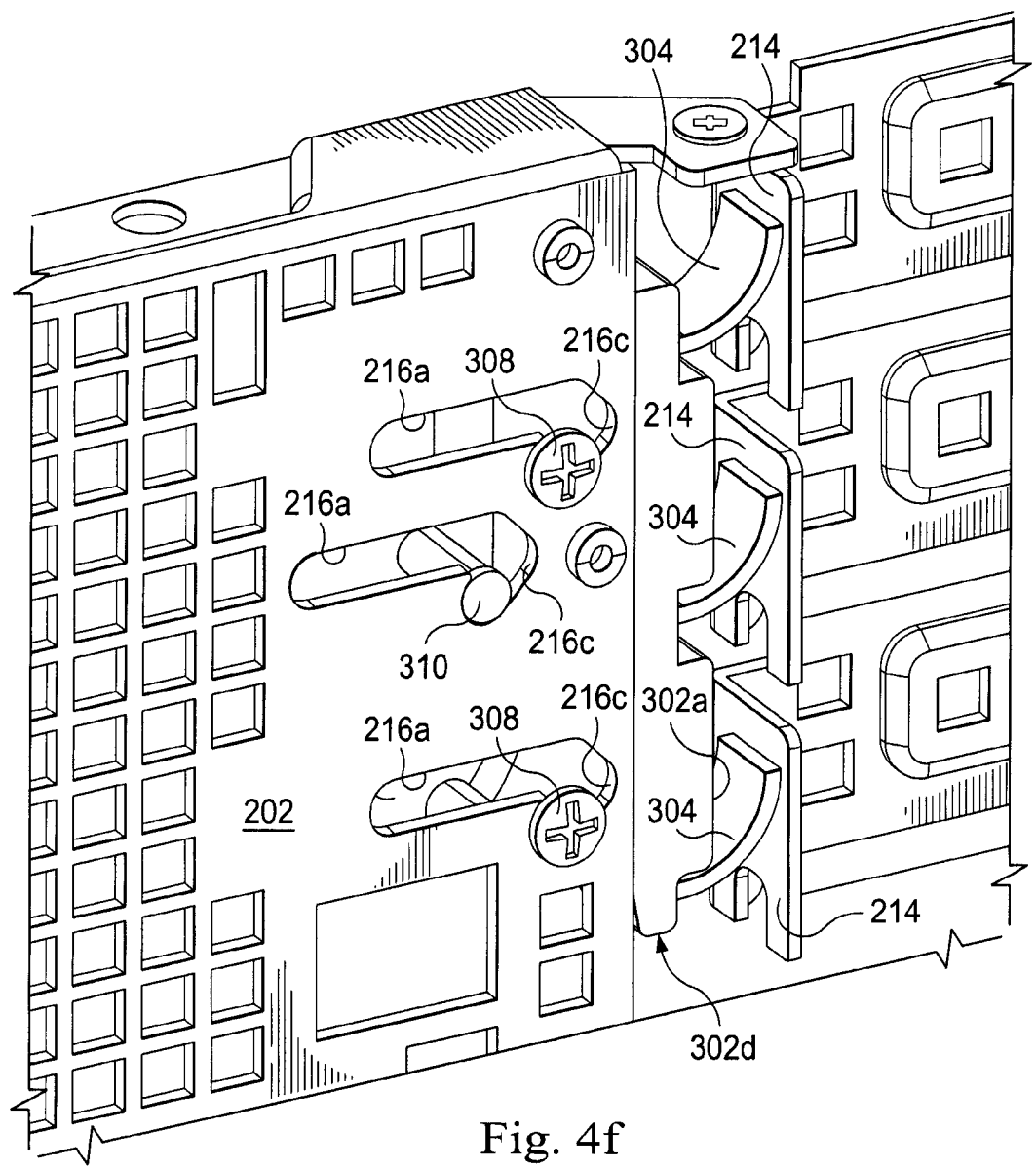
FIG. 4f is a perspective view illustrating an embodiment of the securing member and chassis of FIGS. 4b and 4c with the securing member engaging a plurality of cards.

Referring now to FIGS. 2a, 3b, 3a, 3b, 4a, 4d, 4e and 4f, the method 400 then proceeds to blocks 406 and 408 where the securing member is moved through the actuation channels to retain the cards in the chassis. With the securing member 300 coupled to the chassis 200 with the coupling members 208 and the guide member 310 positioned in the actuation channels 216, the securing member 300 is operable to move relative to the chassis wall 202 along a path defined by the actuation channels 216. In an embodiment, a user of the system may move the securing member 300 by engaging the finger actuation surface 306 on the securing member 300 with a finger and applying a force to the securing member 300 in a direction A, as illustrated in FIG. 4b. The coupling members 308 and the guide member 310 will move through the unsecured sections 216a of the actuation channels 216 such that the securing member 300 moves along a path defined by the unsecured sections 216a of the actuation channels 216. As the coupling members 308 and the guide member 310 reach the end of the unsecured sections 216a of the actuation channels 216, the engagement members 304 will engage the brackets 214 on the cards, as illustrated in FIGS. 4d and 4e. The user of the system may continue to apply a force to the securing member 300 such that the coupling members 308 and the guide member 210 begin to move through the arcuate sections 216c of the actuation channels 216 and the securing member 300 moves along a path defined by the arcuate sections 216c of the actuation channels 216. In an embodiment, movement of the coupling members 308 and the guide member 210 through the arcuate sections 216c of the actuation channels 216 causes the engagement members 304 to resiliently deflect from their rest position, illustrated in FIG. 4b, due to their engagement with the brackets 214. As the coupling members 308 and the guide member 210 reach the end of the arcuate sections 216c of the actuation channels 216, the user of the system may disengage the securing member 300 in order to allow the engagement members 304 to deflect back towards their rest position and move the coupling members 308 and the guide member 310 into the secured sections 216b of the actuation channels 216 such that the securing member 300 moves along a path defined by the secured sections 216b of the actuation channels 216, as illustrated in FIG. 4f. With the coupling members 308 and the guide member 310 located in the secured sections 216b of the actuation channels 216, the engagement members 304 engage the brackets 214 in order to retain the cards 212 in the chassis 200. In an embodiment, the retaining the cards 212 in the chassis 200 includes retaining the cards 212 in the card connectors 210. Thus, a card retention system is provided that is captive to the chassis and allows one handed operation to secure a plurality of cards in a chassis while not effecting the rigidity of a wall that is used with the system. A user may disengage the card retention system in order to, for example, remove the cards 212 from the chassis 200, by engaging the finger actuation surface 306 on the securing member 300 with a finger and applying a force to the securing member 300 in the direction A, as illustrated in FIG. 4*b*, and moving the securing member 300 through the secured sections 216*b* and the arcuate sections 216*c* of the actuation channels 216. In an embodiment, this will cause the engagement members 304 to resiliently deflect against the brackets 214. When the coupling members 308 and the guide member 310 reach the end of the arcuate sections 216*c* that is adjacent the unsecured sections 216*a*, the user may release the securing member 300 and the engagement members 304 will resiliently deflect back into their rest position such that the coupling members 308 and the guide member 310 are moved into the unsecured sections 216*a* of the actuation channels 216 such that the card retention system is disengaged from the cards 212.

Figure 5:
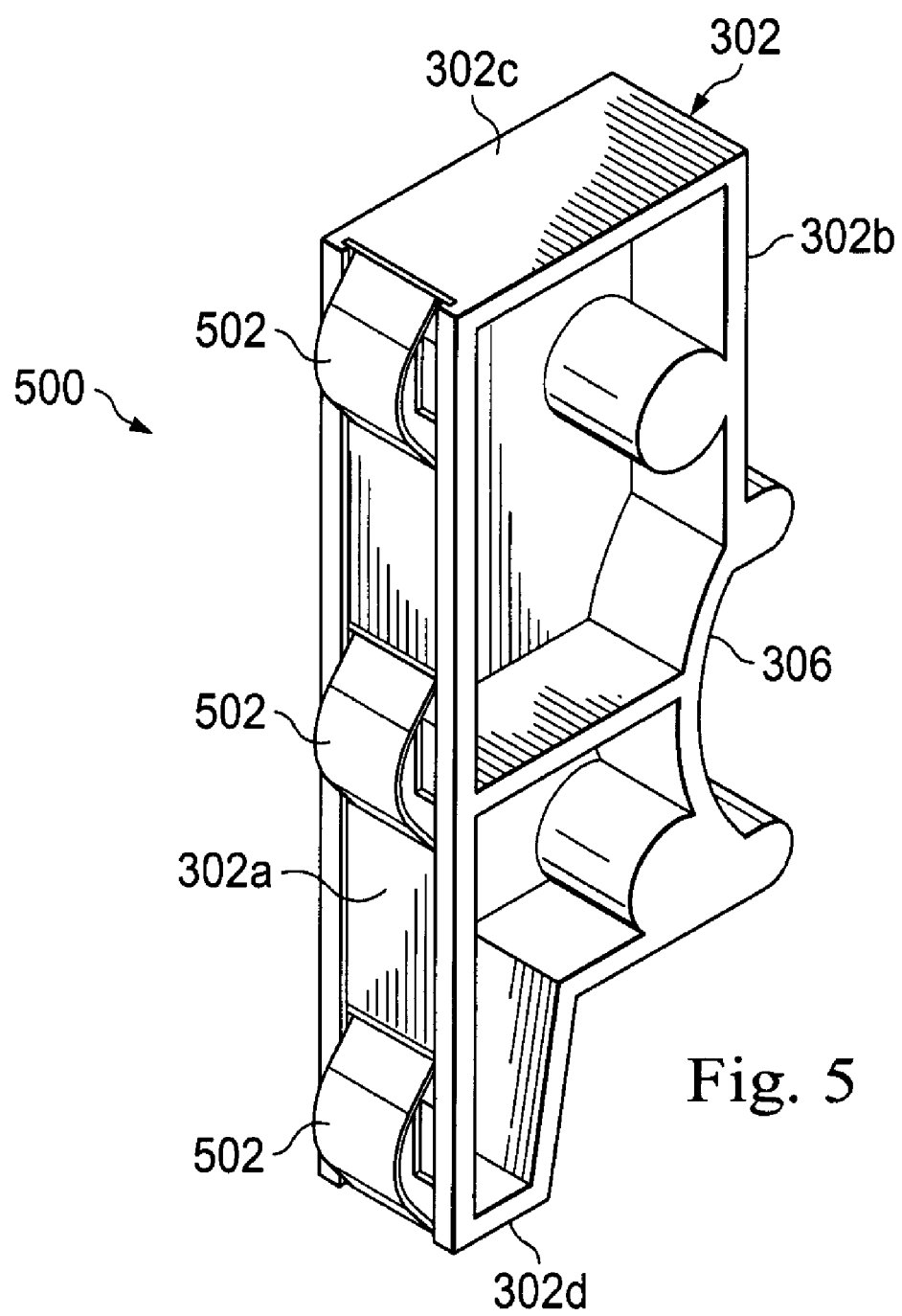
FIG. 5 is a perspective view illustrating an embodiment of a securing member used with the chassis of FIGS. 2a and 2b.

Referring now to FIG. 5, a securing member 500 is illustrated that is substantially similar in structure and operation to the securing member 300 described above with reference to FIGS. 3*a*, 3*b*, 4*a*, 4*b*, 4*c*, 4*d*, 4*e* and 4*f*, with the provision of a plurality of engagements members 502 replacing the engagement members 304. In an embodiment, the base 302 of the securing member 500 is fabricated from a plastic material and the engagement members 502 are fabricated from a metal material in order, for example, to allow increased resiliency of the engagement members 502 and/or to provide grounding for the cards 212. The securing member 500 may replace the securing member 300 and operate in substantially the same manner as discussed above for the method 400.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A card retention system, comprising:
   a chassis comprising a chassis wall;
   a plurality of actuation channels defined by the chassis wall, wherein each of the plurality of actuation channels comprises an unsecured section, a secured section, and an arcuate section extending between the unsecured section and the secured section;
   a securing member coupled to the chassis wall through the plurality of actuation channels, wherein the securing member is operable to move relative to the chassis wall along a path defined by the plurality of actuation channels; and
   a plurality of engagement members located on the securing member.

2. The system of claim 1, wherein a coupling member extends from the securing member and into one of the plurality of actuation channels, and wherein a guide member extends from the securing member and into one of the plurality of actuation channels.

3. The system of claim 1, wherein the plurality of engagement members extend from the securing member in a spaced apart orientation from each other.

4. The system of claim 1, wherein the plurality of engagement members comprise resilient springs.

5. The system of claim 1, wherein the securing member is fabricated from a plastic material and the plurality of engagement members are fabricated from a metal material.

6. The system of claim 1, further comprising:
   a finger actuation surface located on the securing member.

7. The system of claim 1, further comprising:
   a plurality of cards mounted in the IHS chassis; and
   a bracket on each of the plurality of cards, wherein each bracket is located adjacent the chassis wall.

8. The system of claim 7, wherein the securing member is located in the secured sections of the plurality of actuation channels such that each of the plurality of engagement members engages a respective card.

9. An information handling system, comprising:
   a chassis;
   a processor housed in the chassis;
   a memory coupled to the processor;
   a plurality of card connectors coupled to the processor and housed in the chassis adjacent a chassis wall;
   a plurality of actuation channels defined by the chassis wall, wherein each of the plurality of actuation channels comprises an unsecured section, a secured section, and an arcuate section extending between the unsecured section and the secured section;
   a securing member coupled to the chassis wall through the plurality of actuation channels, wherein the securing member is operable to move relative to the chassis wall along a path defined by the plurality of actuation channels; and
   a plurality of engagement members located on the securing member.

10. The system of claim 9, wherein a coupling member extends from the securing member and into one of the plurality of actuation channels, and wherein a guide member extends from the securing member and into one of the plurality of actuation channels.

11. The system of claim 9, wherein the plurality of engagement members extend from the securing member in a spaced apart orientation from each other.

12. The system of claim 9, wherein the plurality of engagement members comprise resilient springs.

13. The system of claim 9, wherein the securing member is fabricated from a plastic material and the plurality of engagement members are fabricated from a metal material.

14. The system of claim 9, further comprising:
    a finger actuation surface located on the securing member.

15. The system of claim 9, further comprising:
    a card coupled to each of the plurality of card connectors; and
    a bracket on each of the cards, wherein each bracket is located adjacent the chassis wall.

16. The system of claim 15, wherein the securing member is located in the secured sections of the plurality of actuation channels such that each of the plurality of engagement members engages a respective card.

17. A method for retaining cards in a chassis, comprising:
    providing a securing member moveably coupled to a chassis wall through a plurality of actuation channels that are defined by the chassis wall and that each include an unsecured section, a secured section, and an arcuate section extending between the unsecured section and the secured section;

positioning a plurality of cards adjacent to the chassis wall;

moving the securing member through the plurality of actuation channels such that each of a plurality of engagement members on the securing member engages a respective card; and retaining the cards adjacent the chassis wall by locating the securing member in the secured sections of each of the plurality of actuation channels such that each of the plurality of engagement members remains in engagement with the respective card.

18. The method of claim 17, wherein the plurality of engagement members comprise resilient springs such that the engagement of each engagement member and each card comprises a resilient engagement.

19. The method of claim 18, wherein moving the securing member through the plurality of actuation channels comprises moving the securing member first through each of the unsecured sections of the plurality of actuation channels, then through each of the arcuate sections of the plurality of actuation channels, and then into each of the secured sections of the plurality of actuation channels.

20. The method of claim 17, wherein a coupling member extends from the securing member and into one of the plurality of actuation channels, and wherein a guide member extends from the securing member and into one of the plurality of actuation channels.

* * * * *